US009496317B2

(12) United States Patent
Choi et al.

(10) Patent No.: US 9,496,317 B2
(45) Date of Patent: Nov. 15, 2016

(54) METHOD OF MANUFACTURING ORGANIC LIGHT EMITTING DISPLAY APPARATUS

(71) Applicant: SAMSUNG DISPLAY CO., LTD., Yongin, Gyeonggi-Do (KR)

(72) Inventors: Min-Hwan Choi, Yongin (KR); Chi-Woo Kim, Yongin (KR); (Continued)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/295,245

(22) Filed: Jun. 3, 2014

(65) Prior Publication Data

US 2015/0179710 A1 Jun. 25, 2015

(30) Foreign Application Priority Data

Dec. 23, 2013 (KR) ........................ 10-2013-0161780

(51) Int. Cl.
*H01L 21/00* (2006.01)
*H01L 27/32* (2006.01)
*H01L 51/56* (2006.01)

(52) U.S. Cl.
CPC ......... *H01L 27/3211* (2013.01); *H01L 27/326* (2013.01); *H01L 51/56* (2013.01)

(58) Field of Classification Search
USPC ........ 438/35, 22, 28, 29, 30, 31, 32, 33, 34, 438/46, 82, 99, 780
See application file for complete search history.

(56) References Cited

U.S. PATENT DOCUMENTS

| 4,468,648 A | 8/1984 | Uchikune |
| 5,487,609 A | 1/1996 | Asada |

(Continued)

FOREIGN PATENT DOCUMENTS

| CN | 1704501 A | 12/2005 |
| CN | 1841696 A | 10/2006 |

(Continued)

OTHER PUBLICATIONS

Patent Abstracts of Japan and English Machine Translation of JP 2001-052862, dated Feb. 23, 2001, listed above, (20 pages).

(Continued)

*Primary Examiner* — Timor Karimy
(74) *Attorney, Agent, or Firm* — Lewis Roca Rothgerber Christie LLP

(57) ABSTRACT

A method of manufacturing an organic light emitting display apparatus by utilizing a deposition apparatus for forming an organic layer on a substrate includes: fixing the substrate to a mask assembly for forming a common layer or a mask assembly for forming a pattern layer in a loading unit; when the one or more deposition assemblies are separated from the substrate, forming an intermediate layer by depositing a deposition material discharged from the one or more deposition assemblies in a deposition unit of the deposition apparatus onto the substrate while the substrate is moved relative to the one or more deposition assemblies by a first conveyer unit; and separating the substrate on which the deposition is finished from the mask assembly for forming the common layer or the mask assembly for forming the pattern layer in an unloading unit.

20 Claims, 9 Drawing Sheets

US 9,496,317 B2

Page 2

(72) Inventors: Gun-Shik Kim, Yongin (KR);
Ok-Keun Song, Yongin (KR);
Kee-Han Uh, Yongin (KR); Seong-Ho Jeong, Yongin (KR); You-Min Cha, Yongin (KR); Jae-Beom Choi, Yongin (KR); Young-Mo Koo, Yongin (KR); Keum-Nam Kim, Yongin (KR); Dae-Sung Choi, Yongin (KR)

(56) References Cited

U.S. PATENT DOCUMENTS

| | | |
|---|---|---|
| 5,909,995 A | 6/1999 | Wolf et al. |
| 6,274,198 B1 | 8/2001 | Dautartas |
| 6,371,451 B1 | 4/2002 | Choi |
| 6,483,690 B1 | 11/2002 | Nakajima et al. |
| 6,749,906 B2 | 6/2004 | Van Slyke |
| 6,995,035 B2 | 2/2006 | Cok et al. |
| 7,964,037 B2 | 6/2011 | Fukuda et al. |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2002/0194727 A1 | 12/2002 | Cho et al. |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0263074 A1 | 12/2005 | Masuda et al. |
| 2006/0102078 A1 | 5/2006 | Fairbairn et al. |
| 2006/0144325 A1 | 7/2006 | Jung et al. |
| 2006/0164786 A1 | 7/2006 | Kobayashi et al. |
| 2006/0174829 A1 | 8/2006 | An et al. |
| 2006/0205101 A1 | 9/2006 | Lee et al. |
| 2006/0255722 A1 | 11/2006 | Imanishi |
| 2006/0278522 A1 | 12/2006 | Kim et al. |
| 2007/0009652 A1 | 1/2007 | Manz et al. |
| 2007/0046913 A1 | 3/2007 | Shibazaki |
| 2007/0077358 A1 | 4/2007 | Jeong et al. |
| 2007/0178708 A1 | 8/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0298947 A1 | 12/2008 | Yeo et al. |
| 2009/0017192 A1 | 1/2009 | Matsuura |
| 2009/0153033 A1 | 6/2009 | Lee et al. |
| 2009/0229524 A1 | 9/2009 | Kim et al. |
| 2009/0232976 A1 | 9/2009 | Yoon et al. |
| 2009/0304907 A1 | 12/2009 | Koparal |
| 2010/0130020 A1 | 5/2010 | Kim et al. |
| 2010/0156279 A1 | 6/2010 | Tamura et al. |
| 2011/0052791 A1* | 3/2011 | Jo et al. .............. 427/8 |
| 2011/0053300 A1 | 3/2011 | Ryu et al. |
| 2011/0241438 A1 | 10/2011 | Kim et al. |
| 2012/0068201 A1 | 3/2012 | Sung et al. |
| 2014/0326275 A1 | 11/2014 | Kim |

FOREIGN PATENT DOCUMENTS

| | | |
|---|---|---|
| EP | 1 413 644 A2 | 4/2004 |
| EP | 1 418 250 A2 | 5/2004 |
| EP | 1 518 940 A1 | 3/2005 |
| JP | 04-272170 A | 9/1992 |
| JP | 5-22405 U | 3/1993 |
| JP | 10-120171 A | 5/1998 |
| JP | 2000-068054 A | 3/2000 |
| JP | 2001-028325 A | 1/2001 |
| JP | 2001-052862 A | 2/2001 |
| JP | 2001-093667 A | 4/2001 |
| JP | 2002-175878 A | 6/2002 |
| JP | 2003-3250 A | 1/2003 |
| JP | 2003-077662 A | 3/2003 |
| JP | 2003-157973 A | 5/2003 |
| JP | 2003-297562 A | 10/2003 |
| JP | 2003-347394 A | 12/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2004-342455 A | 12/2004 |
| JP | 2005-044592 A | 2/2005 |
| JP | 2005-213616 A | 8/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2006-307247 A | 11/2006 |
| JP | 2007-047293 A | 2/2007 |
| JP | 2008-019477 A | 1/2008 |
| JP | 2008-121098 A | 5/2008 |
| JP | 2009-019243 | 1/2009 |
| JP | 2009-87910 A | 4/2009 |
| JP | 2009-117231 A | 5/2009 |
| JP | 2010-159167 A | 7/2010 |
| KR | 1997-0008709 A | 2/1997 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0088662 A | 6/2002 |
| KR | 10-2002-0090934 A | 12/2002 |
| KR | 2003-0043012 A | 6/2003 |
| KR | 10-0405080 B1 | 11/2003 |
| KR | 10-0406059 B1 | 11/2003 |
| KR | 10-2003-0091947 A | 12/2003 |
| KR | 10-2003-0093959 A | 12/2003 |
| KR | 10-0430336 A | 3/2004 |
| KR | 10-2004-0034537 A | 4/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0024324 A | 3/2005 |
| KR | 10-2006-0008602 A | 3/2005 |
| KR | 10-0520159 B1 | 10/2005 |
| KR | 10-2006-0018745 A | 3/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-2007-0056190 A | 6/2007 |
| KR | 10-0723627 B1 | 6/2007 |
| KR | 10-0726132 13 | 6/2007 |
| KR | 10-0736218 B1 | 7/2007 |
| KR | 10-0741142 B1 | 7/2007 |
| KR | 10-2007-0078713 A | 8/2007 |
| KR | 10-2007-0080635 A | 8/2007 |

(56) References Cited

FOREIGN PATENT DOCUMENTS

| KR | 10-2007-0091437 A | 9/2007 |
|---|---|---|
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0823508 B1 | 4/2008 |
| KR | 10-2008-0044239 A | 5/2008 |
| KR | 10-2008-0046761 A | 5/2008 |
| KR | 10-0827760 B1 | 5/2008 |
| KR | 10-2008-0057159 A | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0076574 A | 8/2008 |
| KR | 10-2008-0104479 A | 12/2008 |
| KR | 10-2008-0104695 A | 12/2008 |
| KR | 10-2009-0038733 A | 4/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-2009-0094911 A | 9/2009 |
| KR | 10-2009-0097453 A | 9/2009 |
| KR | 10-2010-0038088 A | 4/2010 |
| KR | 10-2010-0044606 A | 4/2010 |
| KR | 10-2010-0117438 A | 11/2010 |
| KR | 10-2010-0128589 A | 12/2010 |
| KR | 10-1017654 B1 | 2/2011 |
| KR | 10-2011-0110525 A | 10/2011 |
| KR | 10-2012-0029164 A | 3/2012 |
| KR | 10-2013-0008779 A | 1/2013 |
| KR | 10-2014-0130963 | 11/2014 |
| WO | WO 03/043067 A1 | 5/2003 |
| WO | WO 2004/016406 A1 | 2/2004 |

OTHER PUBLICATIONS

Patent Abstracts of Japan and English Machine Translation of JP 2003-3250, dated Jan. 8, 2003, listed above, (25 pages).
Korean Patent Abstracts, Publication No. 10-0151312 B1, dated Jun. 18, 1998, corresponding to Korean Publication 1997-0008709 A listed above.
Korean Patent Abstracts, Publication No. 1020010062735 A, dated Jul. 7, 2001, for corresponding Korean Patent 10-0827760 B1 listed above.
Korean Patent Abstracts, Publication No. 1020020034272 A, dated May 9, 2002, for corresponding Korean Patent 10-0726132 B1 listed above.
Korean Patent Abstracts, Publication No. 1020020056238 A, dated Jul. 10, 2002, for corresponding Korean Patent KR 10-0698033 B1 listed above.
Korean Patent Abstracts, Publication No. 1020020086047 A, dated Nov. 18, 2002, for corresponding Korean Patent 10-0405080 B1 listed above.
Korean Patent Abstracts, Publication No. 1020020088662 A, dated Nov. 29, 2002, for corresponding Korean Patent KR 10-0463212 B1 listed above.
Korean Patent Abstracts, Publication No. 1020040062203 A, dated Jul. 7, 2004, for corresponding Korean Patent R 10-0646160 B1 listed above.
Korean Patent Abstracts, Publication No. 1020050045619 A, dated May 17, 2005, for corresponding Korean Patent KR 10-0520159 B1 listed above.
Korean Patent Abstracts, Publication No. 1020050078637 A, dated Aug. 5, 2005, for corresponding Korean Patent KR 10-0700466 B1 listed above.
Korean Patent Abstracts, Publication No. 1020060101987 A, dated Sep. 27, 2006, for corresponding KR 10-0687007 B1 listed above.
Korean Patent Abstracts, Publication No. 1020060126267 A, dated Dec. 7, 2006, for corresponding Korean Patent 10-0797787 B1 listed above.
Korean Patent Abstracts, Publication No. 1020070025164 A, dated Mar. 8, 2007, for corresponding Korean Patent 10-0711885 B1 listed above.
Korean Patent Abstracts, Publication No. 10-2007-0056241 A, dated Jun. 4, 2007, for corresponding Korean Patent 10-0741142 B1 listed above.
Espacenet—Bibliographic data, Publication No. 2008-0002189 A, dated Jan. 4, 2008, for corresponding Korean Patent KR 10-0800125 B1 listed above.
Korean Patent Abstracts, Publication No. 10-2008-0038650 A, dated May 7, 2008, for corresponding Korean Patent KR 10-0839380 B1 listed above.
Korean Patent Abstracts, Publication No. 10-2008-0070302 A, dated Jul. 30, 2008, for corresponding Korean Patent 10-0899279 B1 listed above.
CN Office action dated Oct. 9, 2012, for CN application 201010266406.6, (6 pages).
European Search Report dated May 27, 2011, corresponding to European Patent application 10251514.5, (11 pages).
KIPO Office action dated Feb. 6, 2012, for Korean Patent application 10-2010-0011480, (8 pages).
KIPO Office action dated Feb. 6, 2012, for Korean Patent application 10-2010-0011481, (7 pages).
KIPO Office action dated Apr. 9, 2012, for Korean Patent application 10-2010-0031556, (4 pages).
KIPO Notice of Allowance dated Apr. 26, 2012, for Korean Patent application 10-2010-0066991, (5 pages).
KIPO Registration Determination Certificate dated Jul. 2, 2012, for Korean Patent application 10-2010-0011480, (5 pages).
KIPO Registration Determination Certificate dated Jul. 2, 2012, for Korean Patent application 10-2010-0011481, (5 pages).
U.S. Office action dated Jun. 21, 2011, for U.S. Appl. No. (12/862,153, now U.S. Pat. No. 8,137,466), (21 pages).
U.S. Office action dated Oct. 3, 2012, for U.S. Appl. No. 12/869,830, (28 pages).
U.S. Office action dated Sep. 2, 2015, for cross reference U.S. Appl. No. 13/938,173, (19 pages).

* cited by examiner

METHOD OF MANUFACTURING ORGANIC LIGHT EMITTING DISPLAY APPARATUS

CROSS-REFERENCE TO RELATED APPLICATION

This application claims priority to and the benefit of Korean Patent Application No. 10-2013-0161780, filed Dec. 23, 2013 in the Korean Intellectual Property Office, the disclosure of which is incorporated herein in its entirety by reference.

BACKGROUND

1. Field

Aspects of one or more embodiments of the present invention are directed toward a method of manufacturing an organic light emitting display apparatus.

2. Description of the Related Art

Organic light emitting display apparatuses have wider viewing angles, better contrast characteristics, and faster response speeds than other display devices, and thus, have drawn attention as a next-generation display device.

An organic light emitting display apparatus includes an intermediate layer between a first electrode and a second electrode that face each other, and the intermediate layer includes an emission layer. The electrodes and the intermediate layer may be formed using (utilizing) various methods, one of which is an independent deposition method. When an organic light emitting display apparatus is manufactured by using the deposition method, a fine metal mask (FMM) having the same pattern as that of an organic layer to be formed is disposed to closely contact a substrate on which the organic layer and the like are formed, and an organic layer material is deposited toward the FMM to form the organic layer having the desired pattern on the substrate.

Information disclosed in this Background section was already known to the inventors of the present invention before achieving the present invention or is technical information acquired in the process of achieving the present invention. Therefore, it may contain information that does not form the prior art that is already known in this country to a person of ordinary skill in the art.

SUMMARY

Aspects of one or more embodiments of the present invention are directed toward a method of manufacturing an organic light emitting display apparatus.

Additional aspects will be set forth in part in the description which follows and, in part, will be apparent from the description or may be learned by practice of the presented embodiments.

According to an embodiment of the present invention, a method of manufacturing an organic light emitting display apparatus by utilizing a deposition apparatus for forming an organic layer on a substrate includes: fixing the substrate to a mask assembly for forming a common layer or a mask assembly for forming a pattern layer in a loading unit; when one or more deposition assemblies are separated from the substrate, forming an intermediate layer by depositing a deposition material discharged from the one or more deposition assemblies in a deposition unit of the deposition apparatus onto the substrate while the substrate is moved relative to the one or more deposition assemblies by a first conveyer unit; and separating the substrate on which the deposition is finished from the mask assembly for forming the common layer or the mask assembly for forming the pattern layer in an unloading unit.

The substrate may be fixed to the mask assembly for forming the common layer in the loading unit, and the deposition material may be formed on the substrate as a common layer.

The forming of the intermediate layer may include forming at least a red emission layer (EML), a green EML, and a blue EML on the substrate as respective common layers.

The substrate may be fixed to the mask assembly for forming the pattern layer in the loading unit, and the deposition material may be formed on the substrate in a pattern.

The forming of the intermediate layer may include forming a red EML, a green EML, and a blue EML on the substrate as respective pattern layers.

Either the mask assembly for forming the common layer or the mask assembly for forming the pattern layer may be coupled to the substrate.

The forming of the intermediate layer may include: forming one EML while the substrate is moved relative to the one or more deposition assemblies when where the substrate is fixed on the mask assembly for forming the pattern layer; returning the mask assembly for forming the pattern layer, to which the substrate is fixed, to the loading unit; and forming another EML on the substrate while the substrate is moved relative to the one or more deposition assemblies.

While one EML is formed, a shielding member may be between the substrate and the one or more deposition assemblies that include a deposition material for forming a different EML.

After the returning of the mask assembly, the mask assembly for forming the pattern layer may be offset with respect to a previous position of the mask assembly on the substrate.

The forming of the intermediate layer may include: forming one or more common layers on the substrate while the substrate is moved relative to the one or more deposition assemblies when where the substrate is fixed on the mask assembly for forming the common layer; separating the substrate from the mask assembly for forming the common layer, and fixing the substrate to the mask assembly for forming the pattern layer; and patterning a red EML, a green EML, and a blue EML on the substrate while the substrate is moved relative to the one or more deposition assemblies when where the substrate is fixed to the mask assembly for forming the pattern layer.

The patterning of the EML on the substrate may include offsetting the mask assembly for forming the pattern layer with respect to a previous position of the mask assembly on the substrate after patterning one EML on the substrate.

The method may further include: after the patterning of the EML on the substrate, separating the substrate from the mask assembly for forming the pattern layer, and fixing the substrate to the mask assembly for forming the common layer; and forming one or more common layers on the substrate while the substrate is moved relative to the one or more deposition assemblies when where the substrate is fixed to the mask assembly for forming the common layer.

The forming of the intermediate layer may include: stacking one or more intermediate layers, including at least an EML configured to emit light having a color, sequentially at a sub-pixel region on the substrate; stacking one or more intermediate layers, including at least an EML configured to emit light having a different color, sequentially at the sub-pixel region on the substrate; and stacking one or more intermediate layers, including at least an EML configured to emit light having a different color, sequentially at the sub-pixel region on the substrate.

The method may further include stacking a red EML, a green EML, and a blue EML at other sub-pixel regions on the substrate.

The forming of the intermediate layer may include: forming one or more common layers on the substrate; patterning an EML at each of a plurality of sub-pixel regions on the substrate; and forming one or more common layers on the substrate.

The method may further include, after the separating of the substrate from the mask assembly, returning the mask assembly for forming the common layer or the mask assembly for forming the pattern layer to the loading unit on a second conveyer unit.

The mask assembly for forming the common layer or the mask assembly for forming the pattern layer may move between the first conveyer unit and the second conveyer unit.

Each of the mask assembly for forming the common layer and the mask assembly for forming the pattern layer may include: a mask including one or more openings for defining deposition regions on the substrate; a mask tray having a surface on which the mask is mounted; and a magnet plate on a surface of the substrate which is opposite to the surface on which the mask is mounted, the magnet plate may be configured to apply a magnetic force to the mask.

The magnet plate may be configured to generate a magnetic force in a direction from the mask toward the magnet plate.

A plurality of the deposition assemblies may be in the deposition unit to sequentially perform the deposition on the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
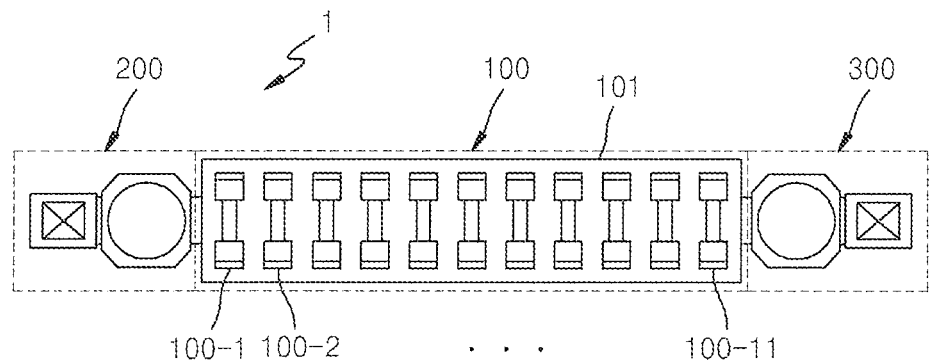
FIG. 1 is a schematic plan view of a deposition apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. It will be understood that although the terms "first", "second", etc. may be used herein to describe various components, these components should not be limited by these terms. These components are only used to distinguish one component from another. As used herein, the singular forms "a," "an," and "the" are intended to include the plural forms as well, unless the context clearly indicates otherwise. It will be further understood that the terms "includes," "including," "comprises," and/or "comprising" used herein specify the presence of stated features, components, or layers but do not preclude the presence or addition of one or more other features, components, or layers. Sizes of layers or elements in the drawings may be exaggerated for convenience of explanation. In other words, because sizes and thicknesses of layers and components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention relates to "one or more embodiments of the present invention."

Figure 2:
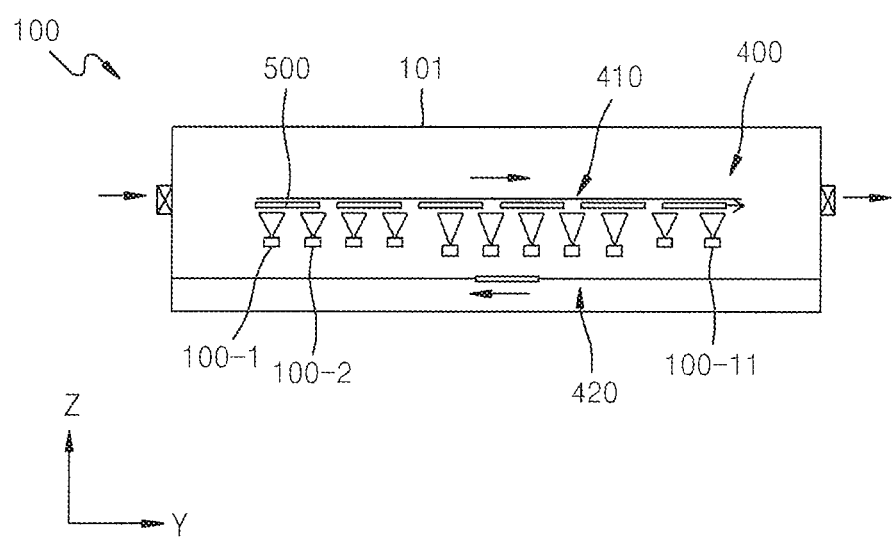
FIG. 2 is a schematic side view of a deposition unit of the deposition apparatus shown in FIG. 1.

FIG. 1 is a schematic plan view of a deposition apparatus 1 according to an embodiment of the present invention, and FIG. 2 is a schematic side view of a deposition unit of the deposition apparatus shown in FIG. 1.

Referring to FIGS. 1 and 2, the deposition apparatus 1 according to the present embodiment includes a deposition unit 100, a loading unit 200, an unloading unit 300, and a conveyer unit 400.

In the loading unit 200, a substrate 500 is coupled to a mask assembly for depositing a common layer (refer to 610 of FIG. 4) or a mask assembly for depositing a pattern layer (refer to 620 of FIG. 6) (hereinafter, the mask assembly 610 for depositing the common layer will be described as an example). For example, a mask tray (refer to 611 of FIG. 4) and a mask (refer to 612 of FIG. 4) are arranged in the loading unit 200, and the substrate 500 is mounted thereon. In this embodiment, a magnet plate (refer to 613 of FIG. 4) is coupled to an upper portion (e.g., an upper side or surface) of the substrate 500. Here, the magnet plate (613 of FIG. 4) generates a magnetic power (e.g., a magnetic field) to attract the mask (611 of FIG. 4) toward the magnet plate (613 of FIG. 4), and thus, the substrate 500 and the mask (612 of FIG. 4) are closely coupled to each other.

The deposition unit 100 is formed at a side of (e.g., in-line with) the loading unit 200 to receive the mask assembly (610 of FIG. 4), to which the substrate 500 is coupled, from the loading unit 200, and deposition material (e.g., a set or predetermined deposition material) is deposited onto the substrate 500 at the deposition unit 100.

Figure 4:
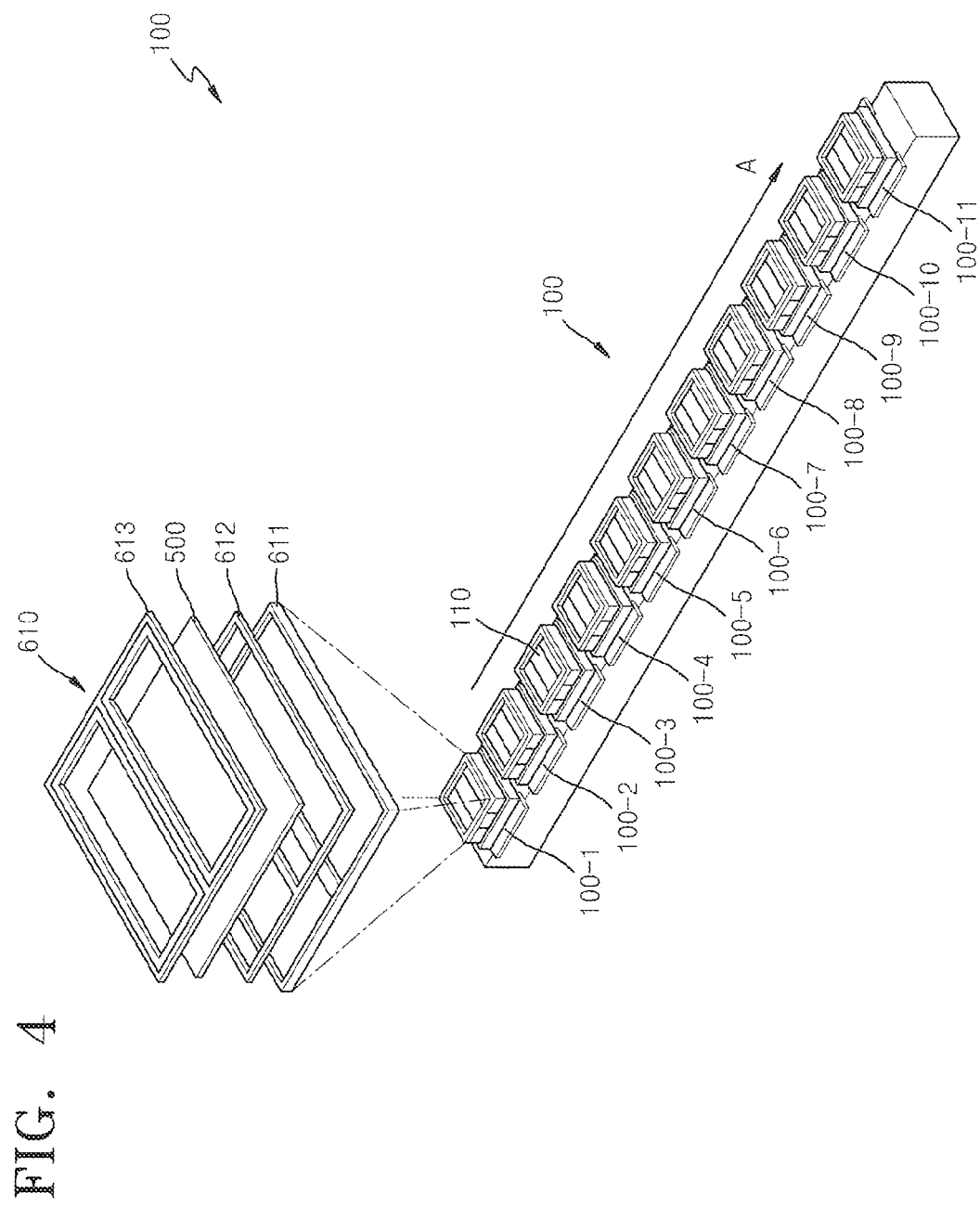
FIG. 4 is a schematic perspective view of a deposition unit shown in FIG. 1.

In the unloading unit 300, the substrate 500, on which the deposition has been completed while passing through the deposition unit 100, is separated from the mask assembly (610 of FIG. 4). The mask assembly (610 of FIG. 4) that is separated from the substrate 500 is returned to the loading unit 200 via a second conveyer unit 420. In order to perform the deposition operation on one substrate 500 a plurality of times, the mask assembly (610 of FIG. 4), to which the substrate 500 is removably coupled, may be returned to the loading unit 200 via the second conveyer unit 420 to perform the deposition operation again.

The deposition unit 100 may include at least one deposition chamber 101. According to the present embodiment shown in FIGS. 1 and 2, the deposition unit 100 includes the chamber 101 in which a plurality of deposition assemblies 100-1 through 100-11 may be disposed. According to the present embodiment shown in FIG. 1, first through eleventh deposition assemblies 100-1 through 100-11 may be disposed in the chamber 101; however, the number of deposition assemblies may vary depending on, for example, a deposition material and deposition conditions. The chamber 101 is maintained in vacuum during the deposition process.

The conveyer unit 400 includes a first conveyer unit 410 and the second conveyer unit 420 for conveying the mask assembly (610 of FIG. 4). For example, the first and second conveyer units 410 and 420 are respectively disposed above and below the deposition assemblies 100-1 through 100-11 in the chamber 101, and the mask assembly (610 of FIG. 4) circulates between (e.g., alternates or moves along) the first and second conveyer units 410 and 420 to perform the deposition operation successively (e.g., repeatedly).

The first conveyer unit 410 conveys the mask assembly (610 of FIG. 4) to which the substrate 500 is coupled in an in-line manner, so that an organic layer may be formed on the substrate 500 by the deposition assembly 100-1.

The second conveyer unit 420 returns the mask assembly (610 of FIG. 4), from which the substrate 500 has been separated in the unloading unit 300 after one deposition cycle is completed, to the loading unit 200 while the mask assembly 610 passes through the deposition unit 100. Otherwise, the mask assembly (610 of FIG. 4), to which the substrate 500 is coupled, may be returned to the loading unit 200 via the second conveyer unit 420 in order to perform the deposition operation for a plurality of times on the one substrate 500.

Here, according to the present embodiment shown in FIG. 1, the mask assembly (610 of FIG. 4), to which the substrate 500 is fixed, may be at least moved to the deposition unit 100. For example, the substrate 500 having the mask assembly (610 of FIG. 4) fixed thereto may be sequentially moved from the loading unit 200, to the deposition unit 100, and to the unloading unit 300 by the first conveyer unit 410, and the mask assembly (610 of FIG. 4) that is separated from the substrate 500 in the unloading unit 300 is returned to the loading unit 200 by the second conveyer unit 420.

The first conveyer unit 410 passes through the chamber 101 when passing through the deposition unit 100, and the second conveyer unit 420 conveys the mask assembly (610 of FIG. 4) from which the substrate 500 is separated.

In the present embodiment, FIGS. 1 and 2 show that the first conveyer unit 410 and the second conveyer unit 420 are respectively disposed above and below the deposition assemblies 100-1 through 100-11; however, embodiments of the present invention are not limited thereto, that is, the first and second conveyer units 410 and 420 may be variously formed or located, for example, at left and right sides of the deposition assemblies 100-1 through 100-11.

Here, the first and second conveyer units 410 and 420 may include various members to move (e.g., move in a reciprocal manner) the mask assembly (610 of FIG. 4), for example, a roller, a linear motor (LM) guide, a magnetic levitation member, etc.

Figure 3:
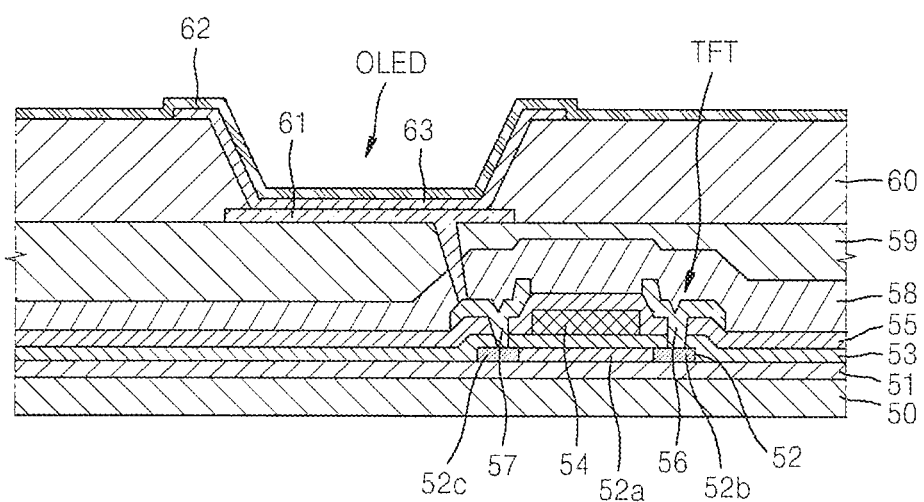
FIG. 3 is a cross-sectional view of an active matrix organic light emitting display apparatus manufactured by the deposition apparatus shown in FIG. 1.

FIG. 3 is a cross-sectional view of an active matrix organic light emitting display apparatus manufactured by the deposition apparatus shown in FIG. 1.

Referring to FIG. 3, various components of the organic light emitting display apparatus are formed on a substrate 500. Here, the substrate 500 may be the substrate 500 shown in FIG. 2 or a part of the substrate 500 obtained by cutting the substrate 500 (e.g., a cross-sectional view of the substrate 500). The substrate 500 may be formed of a transparent material, for example, a glass material, a plastic material, or a metal material.

Common layers such as a buffer layer 51, a gate insulating layer 53, and an interlayer insulating layer 55 may be formed on an entire surface of the substrate 500, a patterned semiconductor layer 52 including a channel region 52*a*, a source contact region 52*b*, and a drain contact region 52*c* may be formed on the substrate 500, and a gate electrode 54, a source electrode 56, and a drain electrode 57 that configure (or form) a thin film transistor (TFT) with the patterned semiconductor layer 52 may be formed on the substrate 500.

Here, the semiconductor layer 52 may be formed to include various materials. For example, the semiconductor layer 52 may include an inorganic semiconductor material such as amorphous silicon or crystalline silicon. As another example, the semiconductor layer 52 may include an oxide semiconductor or an organic semiconductor material.

Also, a protective layer 58 covers the TFT, and a planarization layer 59 located on the protective layer 58 and having a planarized upper surface may be formed on the entire surface of the substrate 500. An organic light emitting device (OLED) including a patterned pixel electrode 61, an opposite electrode 62 corresponding (e.g., roughly corresponding) to the entire surface of the substrate 500, and an intermediate layer 63 of a multi-layered structure including an emission layer and disposed between the pixel electrode 61 and the opposite electrode 62 may be located on the planarization layer 59. Some of (e.g., one or more layers of) the intermediate layer 63 may be a common layer roughly corresponding to the entire surface of the substrate 50, and other layers of the intermediate layer 63 may be pattern layers that are patterned to correspond to the pixel electrode 61. The pixel electrode 61 may be electrically coupled to (e.g., electrically connected to) the TFT via a via opening (e.g., a via hole). A pixel defining layer 60 covering edges of the pixel electrode 61 and having openings for defining pixel regions may be formed on the planarization layer 59 to correspond to the entire surface of the substrate 500.

In the organic light emitting display apparatus, at least some of the components may be manufactured by the deposition apparatus or a method of manufacturing the organic light emitting display apparatus according to the previous embodiments.

For example, the intermediate layer 63 may be formed by the method of manufacturing the deposition apparatus or the organic light emitting display apparatus according to the above embodiments. For example, a hole injection layer (HIL), a hole transport layer (HTL), an emission layer (EML), an electron transport layer (ETL), and an electron injection layer (EIL) may be included in the intermediate layer 63 and may be formed by the method of manufacturing the deposition apparatus or the organic light emitting display apparatus according to the above embodiments.

That is, when forming each layer of the intermediate layer 63 on a substrate on which the pixel electrode 61 is formed, one of the deposition source and the substrate moves relative to the other during the deposition operation. The deposition source is spaced from (e.g., spaced apart from or separated from) the substrate.

Also, in the organic light emitting display apparatus shown in FIG. 3, each unit pixel includes a plurality of sub-pixels that may emit light of various colors. For example, the organic light emitting display apparatus may include sub-pixels respectively emitting red, green, and blue light (e.g., an RGB organic light emitting display), sub-pixels emitting white light (e.g., a white OLED organic light emitting display), or sub-pixels respectively emitting red, green, blue, and white light (e.g., an RGBW organic light emitting display).

That is, the sub-pixels may each include intermediate layers having organic emission layers that emit light having various colors. For example, the sub-pixels include intermediate layers having organic emission layers that emit light having red, green, and/or blue colors.

As another example, the sub-pixels that emit fight having various colors may include intermediate layers (or organic emission layers) that emit light having the same color, for example, white, and may include a color converting layer or a color filter that coverts the white light into a light having a certain color (e.g., a predetermined color).

The intermediate layer emitting the white light may have a variety of structures, for example, a structure in which at least a light-emitting substance emitting a red light, a light-emitting substance emitting a green light, and a light-emitting substance emitting a blue light are stacked on one another. In another example, the intermediate layer emitting the white light may include a structure in which at least a light-emitting substance emitting a red light, a light-emitting substance emitting a green light, and a light-emitting substance emitting a blue light are mixed.

The red, greed, and blue colors are examples, and the present embodiment is not limited thereto. In other words, any combination of other various colors which is capable of emitting a white light may be employed in addition to a combination of red, green, and blue colors.

FIG. 4 is a perspective view of the deposition unit 100 of FIG. 1.

Referring to FIG. 4, the deposition unit 100 of the deposition apparatus 1 according to the embodiment of the present invention may include one or more deposition assemblies 100-1 through 100-11 and the conveyer unit (refer to 400 of FIG. 1). Hereinafter, the configuration of the deposition unit 100 will be described.

The substrate 500, that is, a deposition target, is disposed in the deposition unit 100. The substrate 500 may be a substrate for a flat panel display apparatus, that is, a large sized substrate of 40 inches or greater, such as a mother glass from which a plurality of flat panel display apparatuses may be manufactured.

Here, according to the present embodiment, the deposition is performed while the mask assembly 610, to which the substrate 500 is coupled, moves relative to the deposition assemblies 100-1 through 100-11. That is, the deposition is performed (e.g., continuously performed) while the mask assembly 610, to which the substrate 500 is coupled and is disposed to face the deposition assemblies 100-1 through 100-11, moves along a direction denoted by an arrow A shown in FIG. 4. That is, the deposition is performed in a scanning manner while moving the substrate 500 in the direction denoted by the arrow A of FIG. 4. Here, in FIG. 4, the deposition is performed while the mask assembly 610, to which the substrate 500 is coupled, moves along the A direction in the chamber; however, the embodiments are not limited thereto, that is, the deposition assemblies 100-1 through 100-11 may be moved along the direction A while the substrate 500 is fixed during the deposition process.

In addition, to perform the deposition while the mask assembly 610, to which the substrate 500 is coupled, and the deposition assemblies 100-1 through 100-11 move relative to each other, the deposition assemblies 100-1 through 100-11 and the substrate 500 are configured to be separated from each other by a distance (e.g., a predetermined distance).

Each of the deposition assemblies 100-1 through 100-11 includes at least one deposition source 110 disposed to face the substrate 500 in the chamber 101 and configured to receive and heat (e.g., vaporize) a deposition material. In addition, when the deposition material in the deposition source 110 is vaporized, the deposition material is deposited onto the substrate 500. Here, each of the deposition assemblies 100-1 through 100-11 includes three deposition sources; however, the embodiments of the present invention are not limited thereto, that is, the number and the kinds of the deposition sources may vary depending on, for example, a shape of the deposition apparatus 1, a deposition amount, and a processing time.

Here, according to the deposition apparatus and the deposition method according to the present embodiment, the mask assembly 610 for forming the common layer and the mask assembly (620 of FIG. 6) for forming the pattern layer are disposed and are configured to be replaceable, and thus, an organic light emitting display apparatus emitting red, green, and blue colors (e.g., an RGB organic light emitting display) including sub-pixels respectively emitting red, green, and blue light in one deposition apparatus, and an organic light emitting display apparatus having a white OLED including sub-pixels emitting white light, and an organic light emitting display apparatus emitting red, green, blue, and white colors (e.g., an RGBW organic light emitting display) including sub-pixels respectively emitting red, green, blue, and white light may be selectively manufactured. This will be described in more detail below.

In general, the RGB organic light emitting display apparatus is generally manufactured by (utilizing) a fine metal mask (FMM) in a cluster deposition apparatus. In addition, the white OLED organic light emitting display apparatus is generally manufactured by (utilizing) an open mask in an in-line deposition apparatus.

However, manufacturing the RGB display utilizing the FMM is not suitable for manufacturing a large-sized organic light emitting display apparatus using (utilizing) a mother glass having a large size because the mask may curve due to weight thereof when the corresponding large-sized mask is used (utilized), and the pattern may be distorted due to the curvature. In addition, the RGB pattern cannot be formed using the open mask that forms the white OLED.

To address the above problem, according to the deposition apparatus and the deposition method of the present embodiment, the mask assembly 610 for forming the common layer and the mask assembly (620 of FIG. 6) for forming the pattern layer are disposed together, and the mask assembly 610 for forming the common layer and the mask assembly 620 for forming the pattern layer are configured to be replaceable (e.g., the substrate 500 can be selectively coupled to either the mask assembly 610 for forming the common layer or the mask assembly 620 for forming the pattern layer).

Referring back to FIG. 4, the mask assembly 610 for forming the common layer includes a mask tray 611, a mask 612, and a magnet plate 613.

For example, the mask 612 includes one or more openings to define deposition regions on the substrate 500. In FIG. 4, the mask 612 is formed as an open mask in which the opening is formed (e.g., entirely formed) to be used as a mask for forming the common layer.

The mask tray 611 is formed so that the mask 612 is mounted thereon and acts as a shuttle that is conveyed by the first conveyer unit 410 to the second conveyer unit 420 when the mask 612 and/or the substrate 500 is mounted thereon.

The magnet plate 613 is at a surface of the substrate 500, which is opposite to a surface of the mask that contacts the mask 612, to apply a magnetic force (e.g., a predetermined magnetic force or field) to the mask 612. The magnet plate 613 generates the magnetic force in a direction from the mask 612 toward the magnet plate 613 so that the substrate 500 and the mask 612 are closely coupled to each other, and thereby preventing a gap from being generated between the substrate 500 and the mask 612. Here, the magnet plate 613 may be formed of an elastic, flexible material.

In addition, the eleven deposition assemblies 100-1 through 100-11 shown in FIG. 4 may be used to form the intermediate layer of the organic light emitting display apparatus.

As an example of arranging the eleven deposition assemblies 100-1 through 100-11, the first deposition assembly 100-1 includes a deposition material for forming the HIL and HTL, the second deposition assembly 100-2 includes a deposition material for forming a blue EML, the third deposition assembly 100-3 includes a deposition material for forming the ETL, the fourth deposition assembly 100-4 includes a deposition material for forming a charge generation layer (CGL), the fifth deposition assembly 100-5 includes a deposition material for forming the ETL and a deposition material for forming a blue EML, the sixth deposition assembly 100-6 includes a deposition material for forming the ETL, the seventh deposition assembly 100-7 includes a deposition material for forming a CGL, the eighth deposition assembly 100-8 includes a deposition material for forming the HTL, the ninth deposition assembly 100-9 includes deposition materials for forming a red EML and a green EML, the tenth deposition assembly 100-10 includes a deposition material for forming the ETL, and the eleventh deposition layer 100-11 includes a deposition material for forming the EIL. The arrangement of the deposition assemblies may be variously modified. Also, the deposition assembly that is not used in the deposition operation may not include a deposition material.

Here, a white OLED organic light emitting display apparatus in which a deposition material for emitting red light, a deposition material for emitting green light, a deposition material for emitting blue light are stacked may be manufactured by using the deposition apparatus according to the embodiment shown in FIG. 4.

Figure 5:
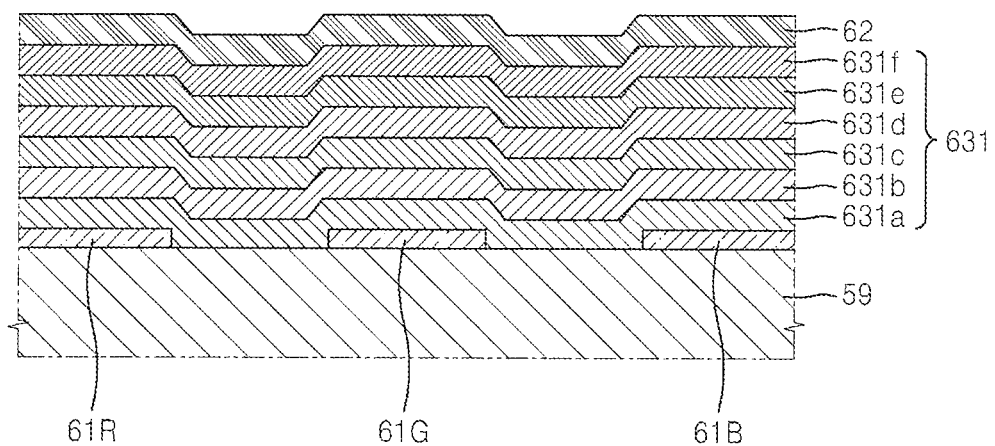
FIG. 5 is a cross-sectional view of an intermediate layer of the organic light emitting display apparatus manufactured by the deposition apparatus shown in FIG. 4.

FIG. 5 is a cross-sectional view of an intermediate layer of an organic light emitting display apparatus manufactured by using the deposition apparatus shown in FIG. 4.

Referring to FIG. 5, the organic light emitting display apparatus manufactured by using the deposition apparatus of FIG. 4 includes pixel electrodes 61R, 61G, and 61B, an intermediate layer 631, and an opposite electrode 62. In addition, the intermediate layer 631 includes an HTL 631a, a blue EML 631b, a CGL 631c, a red EML 631d, a green EML 631e, and an ETL 631f. The intermediate layer 631 may be formed as below.

The mask assembly 610 includes the mask tray 611, the mask 612, and the magnet plate 613, and the mask 612 is an open mask. Thus, a common layer is formed on the substrate 500 while the substrate 500, coupled to the mask assembly 610, passes through or over the deposition assemblies 100-1 through 100-11. That is, the HTL 631a is formed on the substrate 500 when the substrate 500 passes through the first deposition assembly 100-1, the blue EML 631b is formed on the substrate 500 when the substrate 500 passes through the second deposition assembly 100-2, the CGL 631c is formed on the substrate 500 when the substrate 500 passes through the fourth and/or the seventh deposition assemblies 100-4 and/or 100-7, the red EML 631d and the green EML 631e are formed on the substrate 500 when the substrate 500 passes through the ninth deposition assembly 100-9, and the EIL 631f is formed on the substrate 500 when the substrate 500 passes through the tenth deposition assembly 100-10. Here, all the formed layers are formed as common layers.

As described above, the red EML, the green EML, and the blue EML are stacked (or formed) through only one scanning operation by using the mask assembly 610 to form the intermediate layer emitting the white light, and thereby manufacturing the white OLED organic light emitting display apparatus.

Figure 6:
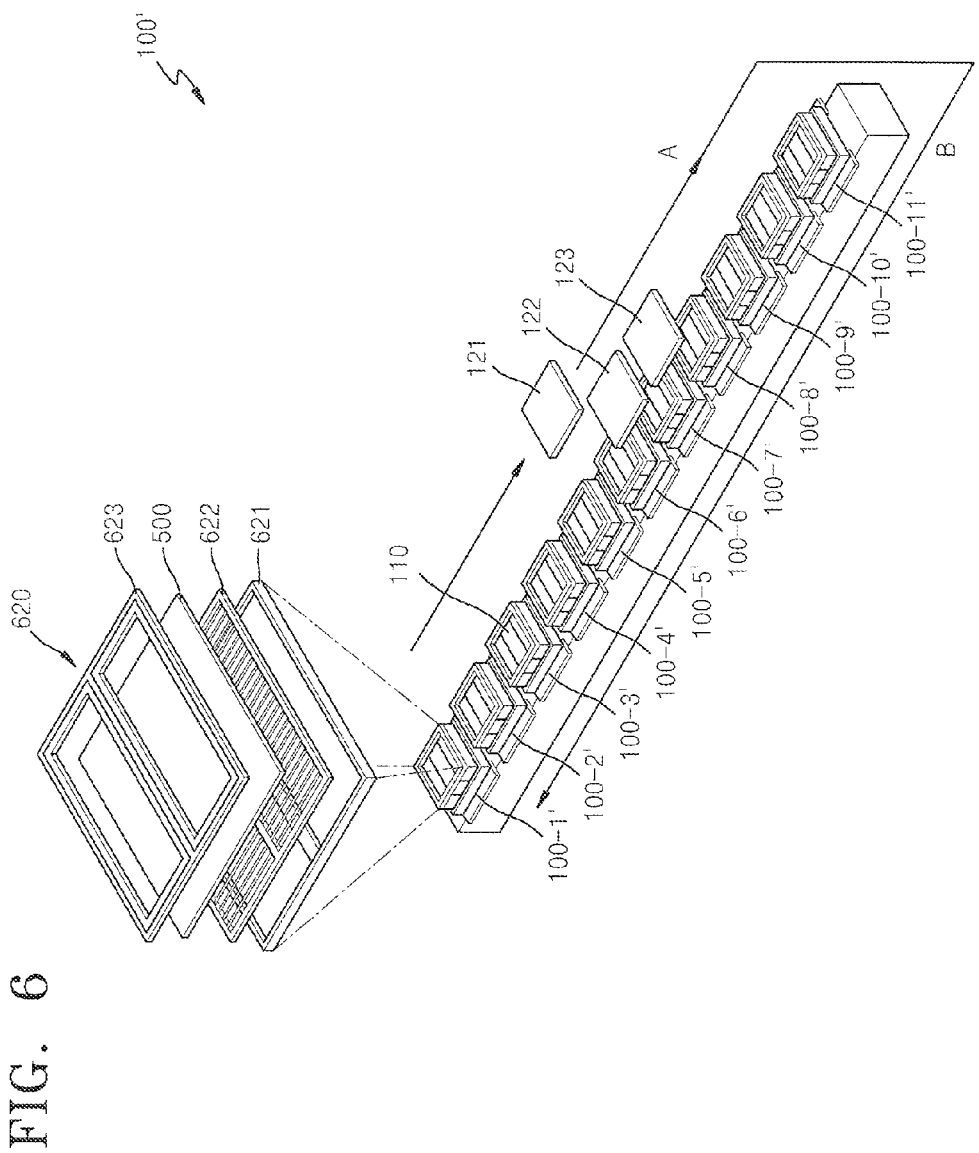
FIG. 6 is a schematic perspective view of another embodiment of the deposition unit shown in FIG. 1.
Figure 7:
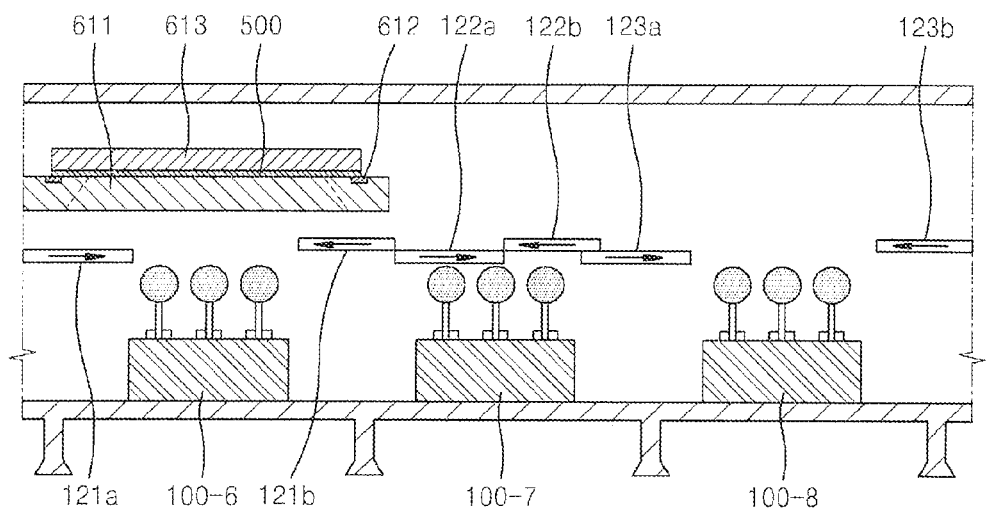
FIG. 7 is a side view of a shielding member shown in FIG. 6.

FIG. 6 is a perspective view of the deposition unit shown in FIG. 1 according to another embodiment, and FIG. 7 is a side view of a shielding member shown in FIG. 6.

In a deposition unit 100' of the deposition apparatus according to another embodiment of the present invention shown in FIGS. 6 and 7, an RGB organic light emitting display apparatus including an organic emission layer, in which a plurality of sub-pixels respectively emit red, green, and blue light, may be manufactured through a plurality of scanning operations by using the mask assembly 620 for forming the pattern layer. This will be described in more detail below.

Referring to FIGS. 6 and 7, the deposition unit 100' of the deposition apparatus according to another embodiment of the present invention includes one or more deposition assemblies 100-1' through 100-11' and the mask assembly 620 for forming a pattern layer. Here, the mask assembly 620 for forming the pattern layer includes a mask tray 621, a mask 622, and a magnet plate 623. In addition, the deposition unit 100' includes shielding members 121, 122, and 123 formed to block (e.g., cover) a certain deposition assembly.

For example, the mask 622 includes a plurality of openings (e.g., slits) for defining deposition regions on the substrate 500. That is, FIG. 6 shows the mask 622 for forming the pattern layer which includes the plurality of openings having shapes (e.g., predetermined shapes) to pattern the deposition materials on desired regions of the substrate 500.

The mask tray 621 is configured so that the mask 622 is mounted thereon and acts as a shuttle conveyed by the first conveyer unit 410 or the second conveyer unit 420 when the mask 622 and/or the substrate 500 is mounted thereon.

The magnet plate 623 is at a surface of the substrate 500, which is opposite to another surface of the substrate 500 which contacts the mask 622, to apply a magnetic force (e.g., a predetermined magnetic force or field) to the mask 622. The magnet plate 623 generates the magnetic force in a direction from the mask 622 toward the magnet plate 623 so that the substrate 500 and the mask 622 are closely coupled to each other, and thereby preventing a gap from being generated between the substrate 500 and the mask 622. Here, the magnet plate 623 may be formed of an elastic, flexible material.

The first shielding member 121 includes a pair of shielding plates 121a and 121b disposed at opposite sides of the sixth deposition assembly 100-6' in order to block the deposition material discharged from the sixth deposition assembly 100-6' by covering or uncovering (e.g., opening or closing) the sixth deposition assembly 100-6' through movements of the shielding plates 121a and 121b. The second and third shielding members 122 and 123 have the same structures as that of the first shielding member 121 (e.g., the second shielding member 122 includes a pair of shielding plates 122a and 122b, and the third shielding member 123 includes a pair of shielding plates 123a and 123b).

In addition, the eleven deposition assemblies 100-1' through 100-11' shown in FIG. 6 may be used to form an intermediate layer of the organic light emitting display apparatus.

As an example of arranging the eleven deposition assemblies 100-1' through 100-11', the first deposition assembly 100-1' and the second deposition assembly 100-2' include deposition materials for forming an HIL, the third, fourth, and fifth deposition assemblies 100-3' through 100-5' include a deposition material for forming an HTL, the sixth deposition assembly 100-6' includes a deposition material for forming a red EML, the seventh deposition assembly 100-7' includes a deposition material for forming a green EML, the eighth deposition assembly 100-8' includes a deposition material for forming a blue EML, the ninth and tenth deposition assemblies 100-9' and 100-10' include a deposition material for forming an ETL, and the eleventh deposition layer 100-11' includes a deposition material for forming an EIL. The arrangement of the deposition assemblies may be variously modified. Also, the deposition assembly that is not used in the deposition operation may not include a deposition material.

Here, the RGB organic light emitting display apparatus, including the plurality of sub-pixels respectively emitting the red, green, and blue light, manufactured by using the mask assembly 620 for forming the pattern layer may be manufactured by using the deposition apparatus shown in FIG. 6.

Figure 8:
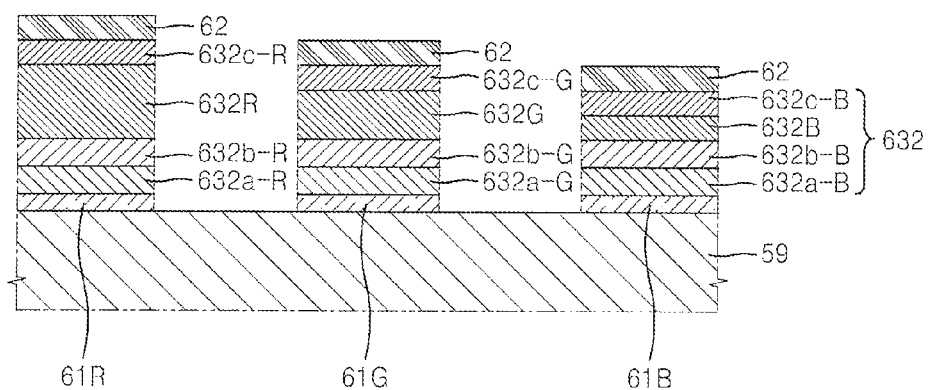
FIG. 8 is a cross-sectional view of an intermediate layer of an organic light emitting display apparatus manufactured by the deposition apparatus shown in FIG. 6.

FIG. 8 is a cross-sectional view of an intermediate layer of an organic light emitting display apparatus that is manufactured by using the deposition apparatus shown in FIG. 6.

Referring to FIG. 8, the organic light emitting display apparatus manufactured by using the deposition apparatus of FIG. 6 includes pixel electrodes 61R, 61G, and 61B, an intermediate layer 632, and an opposite electrode 62. In addition, the intermediate layer 632 is patterned with respect to each of sub-pixels.

That is, a red sub-pixel includes an HIL 632a-R, an HTL 632b-R, a red EML 632R, and an ETL 632c-R that are sequentially patterned and stacked. In addition, a green sub-pixel includes an HIL 632a-G, an HTL 632b-G, a green EML 632G, and an ETL 632c-G that are sequentially patterned and stacked. In addition, a blue sub-pixel includes an HIL 632a-B, an HTL 632b-B, a blue EML 632B, and an ETL 632c-B that are sequentially patterned and stacked. In addition, the opposite electrode 62 is formed as a common layer for covering the intermediate layer 632. Although the opposite electrode 62 appears to be a pattern layer because FIG. 8 omits spaces between the sub-pixels, the opposite electrode 62 is formed as a common layer (e.g., the opposite electrode 62 is not patterned to correspond to the sub-pixels 61R, 61G, and 61B).

The intermediate layer 632 may be formed as below.

The mask assembly 620 for forming the pattern layer includes the mask tray 621, the mask 622, and the magnet plate 623, and the mask 622 is formed as a pattern mask including a plurality of openings (e.g., slits). Thus, pattern layers are formed on the substrate 500 when the substrate 500, coupled to the mask assembly 620 for forming the pattern layer, passes through (or over) the deposition assemblies 100-1' through 100-11'.

That is, during a first scanning operation, when the substrate 500 passes through the first and second deposition assemblies 100-1' and 100-2', the HIL 632a-R is formed on the substrate 500, when the substrate 500 passes through the third, fourth, and fifth deposition assemblies 100-3', 100-4', and 100-5', the HTL 632b-R is formed on the substrate 500. In addition, when the substrate 500 passes through the sixth deposition assembly 100-6', the red EML 632R is formed on the substrate 500, and when the substrate 500 passes through the ninth and tenth deposition assemblies 100-9' and 100-10', the ETL 632c-R is formed on the substrate 500. Here, all of the layers are formed as the pattern layers stacked at the red sub-pixel. Here, the second shielding member 122 is formed between (e.g., is extended between) the seventh deposition assembly 100-7' for forming the green EML and the substrate 500 so the green light emitting material is not deposited on the substrate 500, and the third shielding member 123 is disposed between (e.g., is extended between) the eighth deposition assembly 100-8' for forming the blue EML and the substrate 500 so the blue light emitting material is not deposited on the substrate 500.

The mask assembly 620 for forming the pattern layer (and the substrate 500 coupled thereto) on which the scanning deposition operation is performed once is returned to the loading unit 200 by the second conveyer unit (420 of FIG. 2). Thereafter, the mask assembly 620 for forming the pattern layer is offset (e.g., offset by a predetermined degree) with respect to the substrate 500 for forming next pattern layer (e.g., the mask assembly 620 may be offset or moved with respect to a previous position of the mask assembly 620 on the substrate 500).

Likewise, during a second scanning operation, the HIL 632a-G, the HTL 632b-G, the green EML 632G, and the ETL 632c-G are formed on the substrate 500 when the substrate 500 passes through the deposition assemblies 100-1' through 100-111'. Here, all of the layers are formed as pattern layers at the green sub-pixel, and the intermediate layer is horizontally separated by a gap (e.g., by a predetermined gap) from the intermediate layer formed during the first scanning operation. Here, the first shielding member 121 is formed between (e.g., is extended between) the sixth deposition assembly 100-6' for forming the red EML 632R and the substrate 500 so the red light emitting material is not deposited on the substrate 500, and the third shielding member 123 is disposed between (e.g., is extended between) the eighth deposition assembly 100-8' for forming the blue EML and the substrate 500 so the blue light emitting material is not deposited on the substrate 500.

The mask assembly 620 for forming the pattern layer (and the substrate 500 coupled thereto), on which the second scanning deposition operation is performed, is returned to the loading unit 200 by the second conveyer unit (420 of FIG. 2). Thereafter, the mask assembly 620 for forming the pattern layer is offset (e.g., offset by a predetermined degree) with respect to the substrate 500 for forming (before forming) next pattern layer.

Likewise, during a third scanning operation, the HIL 632a-B, the HTL 632b-B, the blue EML 632B, and the ETL 632c-B are formed on the substrate 500 when the substrate 500 passes through the deposition assemblies 100-1' through 100-11'. Here, all of the layers are formed as pattern layers at the blue sub-pixel, and the intermediate layer is horizontally separated by a gap (e.g., by a predetermined gap) from the intermediate layers formed during the first and second scanning operations. Here, the first shielding member 121 is formed between (e.g., is extended between) the sixth deposition assembly 100-6' for forming the red EML 632R and the substrate 500 so the red light emitting material is not deposited on the substrate 500, and the second shielding member 122 is disposed between (e.g., is extended between) the seventh deposition assembly 100-7' for forming the green EML and the substrate 500 so the green light emitting material is not deposited on the substrate 500.

As described above, the RGB organic light emitting display apparatus may be manufactured by forming the intermediate layer including the organic emission layers respectively emitting red, green, and blue light at the plurality of sub-pixels through the plurality of scanning operation by using the mask assembly 620 for forming the pattern layer.

Figure 9:
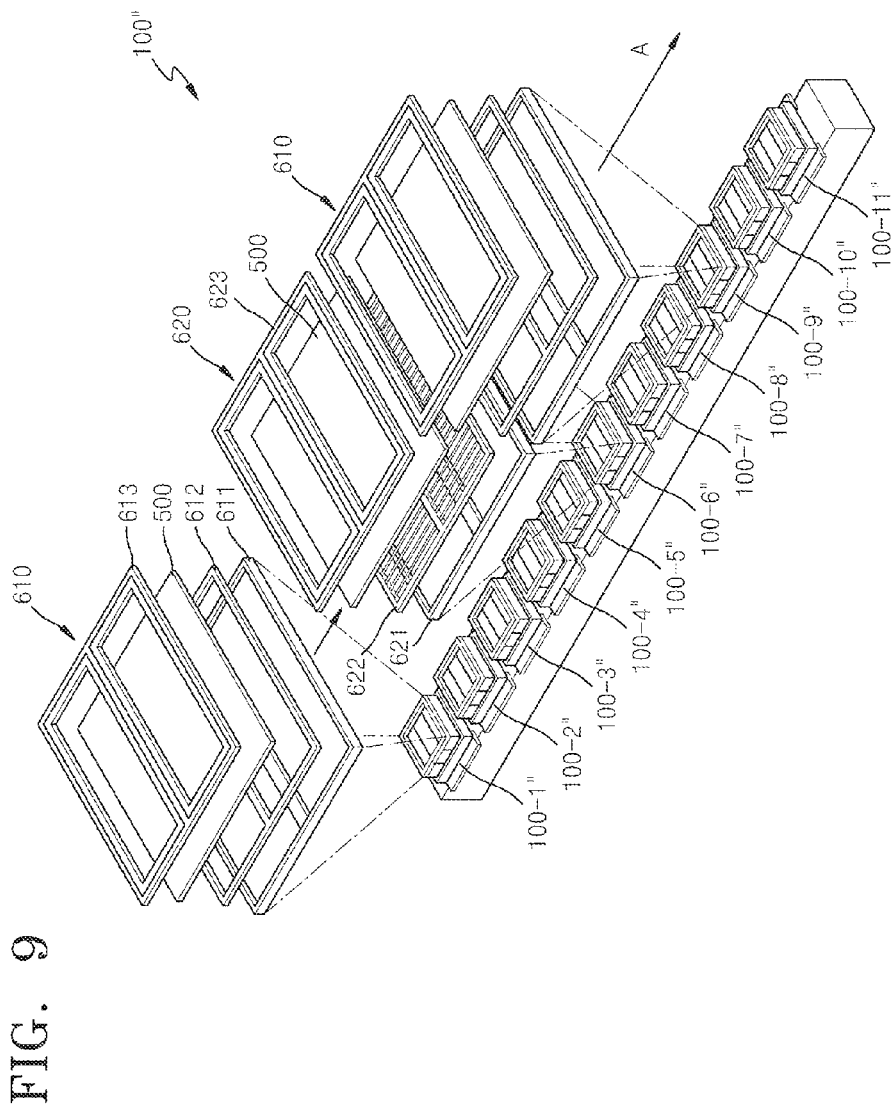
FIG. 9 is a perspective view of another embodiment of the deposition unit shown in FIG. 1.

FIG. 9 is a schematic perspective view showing another embodiment of the deposition unit of FIG. 1.

In the deposition unit 100" according to another embodiment of the present invention shown in FIG. 9, an RGB organic light emitting display apparatus having a structure in which each of the plurality of sub-pixels includes an organic emission layer emitting red, green, or blue light may be manufactured through a scanning operation by using the mask assembly 610 for forming a common layer and the mask assembly 620 for forming a pattern layer. This will be described in more detail below.

Referring to FIG. 9, the deposition unit 100" of the deposition apparatus according to another embodiment of the present invention includes one or more deposition assemblies 100-1" through 100-11", the mask assembly 610 for forming a common layer, and the mask assembly 620 for forming a pattern layer. Here, the mask assembly 610 for forming the common layer includes the mask tray 611, the mask 612, and the magnet plate 613, and the mask assembly 620 for forming the pattern layer includes the mask tray 621, the mask 622, and the magnet plate 623. In the present embodiment, the mask assembly 610 for forming the common layer is the same or substantially the same as the mask assembly for forming the common layer described with reference to FIG. 4, and the mask assembly 620 for forming the pattern layer is the same or substantially the same as the mask assembly described with reference to FIG. 6, and thus, detailed descriptions thereof may not be repeated.

The eleven deposition assemblies 100-1" through 100-11" shown in FIG. 9 may be used to form the intermediate layer of the organic light emitting display apparatus.

As an example of arranging the eleven deposition assemblies, the first deposition assembly 100-1" and the second deposition assembly 100-2" include deposition materials for forming an HIL, the third, fourth, and fifth deposition assemblies 100-3" through 100-5" include a deposition material for forming an HTL, the sixth deposition assembly 100-6" includes a deposition material for forming a red EML, the seventh deposition assembly 100-7" includes a deposition material for forming a green EML, the eighth deposition assembly 100-8" includes a deposition material for forming a blue EML, the ninth and tenth deposition assemblies 100-9" and 100-10" include a deposition material for forming an ETL, and the eleventh deposition layer 100-11" includes a deposition material for forming an EIL. In one embodiment, the arrangement of the deposition assemblies may be variously modified. Also, the deposition assembly that is not used in the deposition operation may not include a deposition material.

Here, the RGB organic light emitting display apparatus having a structure in which the plurality of sub-pixels respectively emit red, green, and blue light manufactured by using the mask assembly 610 for forming the common layer and the mask assembly 620 for forming the pattern layer may be manufactured by using the deposition apparatus according to the present embodiment shown in FIG. 9.

Figure 10:
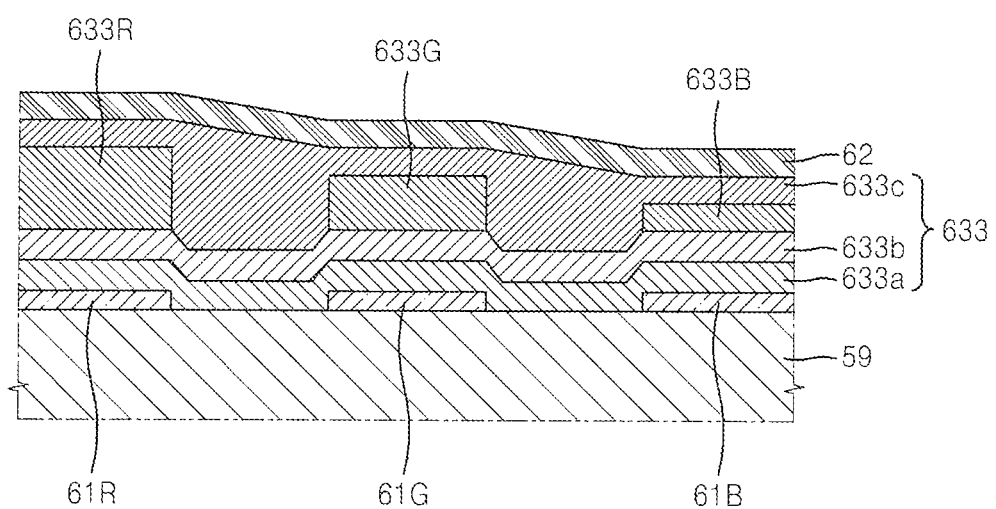
FIG. 10 is a cross-sectional view of an intermediate layer of an organic light emitting display apparatus manufactured by the deposition unit shown in FIG. 9.

FIG. 10 is a cross-sectional view of an intermediate layer in the organic light emitting display apparatus manufactured by using the deposition apparatus shown in FIG. 9.

Referring to FIG. 10, the organic light emitting display apparatus manufactured by using the deposition apparatus shown in FIG. 9 includes pixel electrodes 61R, 61G, and 61B, an intermediate layer 633, and an opposite electrode 62. In addition, the intermediate layer 633 includes an HIL 633a, an HTL 633b, a red EML 633R, a green EML 633G, a blue EML 633B, and an ETL 633c.

In the intermediate layer 633, the EMLs 633R, 633G, and 633B are patterned with respect to the sub-pixels, and the HIL 633a, the HTL 633b, and the ETL 633c are formed as common layers. The intermediate layer 633 is formed as below.

The mask assembly 610 for forming the common layer includes the mask tray 611, the mask 612, and the magnet plate 613. Here, the mask 612 is formed as an open mask, and thus, the common layer is formed on the substrate 500 when the substrate 500, coupled to the mask assembly 610 for forming the common layer, passes through (or over) the deposition assemblies.

In addition, the mask assembly 620 for forming the pattern layer includes the mask tray 621, the mask 622, and the magnet plate 623. Because the mask 622 is formed as a pattern mask including the plurality of openings (e.g., slits), pattern layers are formed on the substrate 500 when the substrate 500 coupled to the mask assembly 620 for forming the pattern layer passes through the deposition assemblies.

The deposition starts when the substrate 500 is coupled to the mask assembly 610 for forming the common layer. That is, the HIL 633a is formed on the substrate 500 when the substrate 500 passes through the first and second deposition assemblies 100-1" and 100-2", and the HTL 633b is formed on the substrate 500 when the substrate 500 passes through the third through fifth deposition assemblies 100-3" through 100-5". Here, the HIL 633a and the HTL 633b are formed and stacked as common layers.

After separating the substrate 500 from the mask assembly 610 for forming the common layer, the substrate 500 is coupled to the mask assembly 620 for forming the pattern layer. After that, the red EML 633R is formed at the red sub-pixel on the substrate 500 when the substrate 500 passes through the sixth deposition assembly 100-6". Then, the mask assembly 620 for forming the pattern layer is offset (e.g., offset by a predetermined degree) with respect to the substrate 500. That is, for forming next pattern layer, the mask assembly 620 for forming the pattern layer is moved in a direction parallel with the substrate 500. After that, the green EML 633G is formed at the green sub-pixel of the substrate 500 when the substrate 500 passes through the seventh deposition assembly 100-7". Then, the mask assembly 620 for forming the pattern layer is offset (e.g., offset a predetermined degree) with respect to the substrate 500. After that, the blue EML 633B is formed at the blue sub-pixel of the substrate 500 when the substrate 500 passes through the eighth deposition assembly 100-8". Here, the red EML 633R, the green EML 633G, and the blue EML 633B are formed at the sub-pixels as pattern layers (patterned layers).

Then, the substrate 500 is separated from the mask assembly 620 for forming the pattern layer and is then coupled to the mask assembly 610 for forming the common layer. After that, the ETL 633c is formed on the substrate 500 when the substrate 500 passes through the ninth and tenth deposition assemblies 100-9" and 100-10". Here, the ETL is formed and stacked as a common layer.

As described above, by using the mask assembly 610 for forming the common layer and the mask assembly 620 for forming the pattern layer together (e.g., concurrently), the RGB organic light emitting display apparatus having the intermediate layer including the plurality of sub-pixels respectively emitting red, green, and blue light may be manufactured by moving along one scanning direction.

Figure 11:
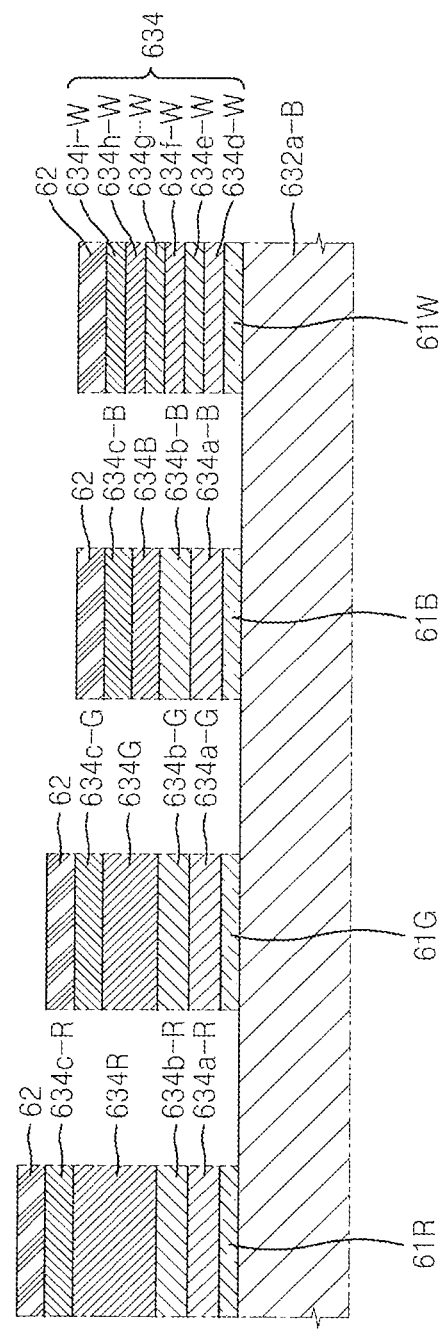
FIG. 11 is a cross-sectional view of an intermediate layer of an organic light emitting display apparatus manufactured by a deposition unit according to another embodiment of the present invention.

FIG. 11 is a cross-sectional view of an intermediate layer of an organic light emitting display apparatus manufactured by using a deposition apparatus according to another embodiment of the present invention. In the present embodiment, an RGBW organic light emitting display apparatus in which a plurality of sub-pixels respectively emit red, green, blue, and white light may be manufactured by using a mask assembly for forming a pattern layer through a plurality of scanning operations.

Referring to FIG. 11, the organic light emitting display apparatus according to the present embodiment includes pixel electrodes 61R, 61G, 61B, and 61W, an intermediate layer 634, and an opposite electrode 62. In addition, the intermediate layer 634 is patterned for each of the sub-pixels.

That is, an HIL 634*a*-R, an HTL 634*b*-R, a red EML 634R, and an ETL 634*c*-R are sequentially patterned at a red sub-pixel. In addition, an HIL 634*a*-G, an HTL 634*b*-G, a green EML 634G, and an ETL 634*c*-G are sequentially patterned at a green sub-pixel. Also, an HIL 634*a*-B, an HTL 634*b*-B, a blue EML 634B, and an ETL 634*c*-B are sequentially patterned at a blue sub-pixel. In addition, an HTL 634*d*-W, a blue EML 634*e*-W, a CGL 634*f*-W, a red EML 634*g*-W, a green EML 634*h*-W, and an ETL 634*l*-W are sequentially patterned at a white sub-pixel. In addition, the opposite electrode 62 is formed as a common layer for covering the entire intermediate layer 634.

As described above, the RGBW organic light emitting display apparatus may be manufactured by forming the intermediate layer emitting the red, green, blue, or white light at each of the plurality of sub-pixels through the plurality of scanning operations by using the mask assembly for forming the pattern layer.

According to the embodiments of the present invention, the deposition processes may be flexibly applied to a large-sized organic light emitting display apparatus. That is, the RGB, the RGBW, or the white OLED organic light emitting display apparatus may be selectively manufactured by using the same deposition apparatus, and thus, the manufacturing equipment may be managed flexibly. Also, a layout of the equipment may be reduced when compared with a comparable cluster deposition apparatus, space utility may be improved, and the processing time may be reduced by applying the in-line deposition apparatus.

As described above, according to the one or more of the above embodiments of the present invention, spatial efficiency and manufacturing efficiency may be improved.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A method of manufacturing an organic light emitting display apparatus by utilizing a deposition apparatus for forming an organic layer on a substrate, the method comprising:
    fixing the substrate to a mask assembly for forming a common layer or to a mask assembly for forming a pattern layer, the fixing of the substrate being in a loading unit;
    forming an intermediate layer on the substrate by depositing a deposition material discharged from one or more deposition assemblies in a deposition unit of the deposition apparatus onto the substrate while the substrate is moved relative to the one or more deposition assemblies by a first conveyer unit, the one or more deposition assemblies being separated from the substrate; and
    separating the substrate, on which the deposition is finished, from the mask assembly for forming the common layer or from the mask assembly for forming the pattern layer, the separating of the substrate being in an unloading unit.

2. The method of claim 1, wherein the substrate is fixed to the mask assembly for forming the common layer in the loading unit, and the deposition material is formed on the substrate as a common layer.

3. The method of claim 2, wherein the forming of the intermediate layer comprises forming at least a red emission layer, a green emission layer, and a blue emission layer on the substrate as respective common layers.

4. The method of claim 1, wherein the substrate is fixed to the mask assembly for forming the pattern layer in the loading unit, and the deposition material is formed on the substrate in a pattern.

5. The method of claim 4, wherein the forming of the intermediate layer comprises forming a red emission layer, a green emission layer, and a blue emission layer on the substrate as respective pattern layers.

6. The method of claim 1, wherein either the mask assembly for forming the common layer or the mask assembly for forming the pattern layer is coupled to the substrate.

7. The method of claim 1, wherein the forming of the intermediate layer comprises:
    stacking one or more intermediate layers, comprising at least an emission layer configured to emit light having a color, sequentially at a sub-pixel region on the substrate;
    stacking one or more intermediate layers, comprising at least an emission layer configured to emit light having a different color, sequentially at the sub-pixel region on the substrate; and stacking one or more intermediate layers, comprising at least an emission layer configured to emit light having a different color, sequentially at the sub-pixel region on the substrate.

8. The method of claim 7, further comprising stacking a red emission layer, a green emission layer, and a blue emission layer at other sub-pixel regions on the substrate.

9. The method of claim 1, wherein the forming of the intermediate layer comprises:
forming one or more common layers on the substrate;
patterning an emission layer at each of a plurality of sub-pixel regions on the substrate; and
forming one or more additional common layers on the substrate.

10. The method of claim 1, further comprising, after the separating of the substrate from the mask assembly, returning the mask assembly for forming the common layer or the mask assembly for forming the pattern layer to the loading unit on a second conveyer unit.

11. The method of claim 10, wherein the mask assembly for forming the common layer or the mask assembly for forming the pattern layer moves between the first conveyer unit and the second conveyer unit.

12. The method of claim 1, wherein a plurality of deposition assemblies are in the deposition unit to sequentially perform the deposition on the substrate.

13. A method of manufacturing an organic light emitting display apparatus by utilizing a deposition apparatus for forming an organic layer on a substrate, the method comprising:
fixing the substrate to a mask assembly for forming a common layer or to a mask assembly for forming a pattern layer, the fixing of the substrate being in a loading unit;
when one or more deposition assemblies are separated from the substrate, forming an intermediate layer by depositing a deposition material discharged from the one or more deposition assemblies in a deposition unit of the deposition apparatus onto the substrate while the substrate is moved relative to the one or more deposition assemblies by a first conveyer unit, the forming of the intermediate layer comprising:
forming one emission layer while the substrate is moved relative to the one or more deposition assemblies when the substrate is fixed on the mask assembly for forming the pattern layer;
returning the mask assembly for forming the pattern layer, to which the substrate is fixed, to the loading unit; and
forming another emission layer on the substrate while the substrate is moved relative to the one or more deposition assemblies; and
separating the substrate, on which the deposition is finished, from the mask assembly for forming the common layer or from the mask assembly for forming the pattern layer, the separating of the substrate being in an unloading unit.

14. The method of claim 13, wherein while one emission layer is formed, a shielding member is between the substrate and the one or more deposition assemblies that comprise a deposition material for forming a different emission layer.

15. The method of claim 13, wherein after the returning of the mask assembly, the mask assembly for forming the pattern layer is offset with respect to a previous position of the mask assembly on the substrate.

16. The method of claim 1, wherein the forming of the intermediate layer comprises:
forming one or more common layers on the substrate while the substrate is moved relative to the one or more deposition assemblies when the substrate is fixed to the mask assembly for forming the common layer;
separating the substrate from the mask assembly for forming the common layer, and fixing the substrate to the mask assembly for forming the pattern layer; and
patterning a red emission layer, a green emission layer, and a blue emission layer on the substrate while the substrate is moved relative to the one or more deposition assemblies when the substrate is fixed to the mask assembly for forming the pattern layer.

17. The method of claim 16, wherein the patterning of the emission layer on the substrate comprises offsetting the mask assembly for forming the pattern layer with respect to a previous position of the mask assembly on the substrate after patterning one emission layer on the substrate.

18. The method of claim 16 further comprising:
after the patterning of the red emission layer, the green emission layer, and the blue emission layer on the substrate, separating the substrate from the mask assembly for forming the pattern layer, and fixing the substrate to the mask assembly for forming the common layer; and
forming one or more common layers on the substrate while the substrate is moved relative to the one or more deposition assemblies when the substrate is fixed to the mask assembly for forming the common layer.

19. A method of manufacturing an organic light emitting display apparatus by utilizing a deposition apparatus for forming an organic layer on a substrate, the method comprising:
fixing the substrate to a mask assembly for forming a common layer or to a mask assembly for forming a pattern layer, the fixing of the substrate being in a loading unit;
when one or more deposition assemblies are separated from the substrate, forming an intermediate layer by depositing a deposition material discharged from the one or more deposition assemblies in a deposition unit of the deposition apparatus onto the substrate while the substrate is moved relative to the one or more deposition assemblies by a first conveyer unit; and
separating the substrate, on which the deposition is finished, from the mask assembly for forming the common layer or from the mask assembly for forming the pattern layer, the separating of the substrate being in an unloading unit,
wherein each of the mask assembly for forming the common layer and the mask assembly for forming the pattern layer comprises:
a mask including one or more openings for defining deposition regions on the substrate;
a mask tray having a surface on which the mask is mounted; and
a magnet plate on a surface of the substrate which is opposite to the surface on which the mask is mounted, the magnet plate being configured to apply a magnetic force to the mask.

20. The method of claim 19, wherein the magnet plate is configured to generate a magnetic force in a direction from the mask toward the magnet plate.

* * * * *